US005545940A

United States Patent [19]
Wright

[11] Patent Number: 5,545,940
[45] Date of Patent: Aug. 13, 1996

[54] MULTITRACK TRANSVERSELY FOLDED SURFACE ACOUSTIC WAVE STRUCTURE

[75] Inventor: Peter V. Wright, Dallas, Tex.

[73] Assignee: RF Monolithics, Inc., Dallas, Tex.

[21] Appl. No.: 335,036

[22] Filed: Nov. 7, 1994

[51] Int. Cl.$^6$ .................................................. H01L 41/08
[52] U.S. Cl. ............................ 310/313 D; 310/313 B
[58] Field of Search ............................ 310/313 R, 313 B, 310/313 D; 333/150–154, 193–196

[56] References Cited

U.S. PATENT DOCUMENTS

| 4,178,571 | 12/1979 | Mitchell | 333/194 |
| 4,494,031 | 1/1985 | Barnes et al. | 310/313 B |
| 5,426,339 | 6/1995 | Wright | 310/313 D |

FOREIGN PATENT DOCUMENTS

| 2682833 | 10/1991 | France. | |
| 2685580 | 12/1991 | France. | |
| WO9308641 | 8/1992 | WIPO. | |

OTHER PUBLICATIONS

Machui et al., Z-Path If- Filters For Mobile Telephones, *1992 Ultrasonics Symposium*, pp. 147–150.
Lewis, Saw Filters Employing Interdigitated Interdigital Transducers, IIDT, *1982 Ultrasonics Symposium*, pp. 12–17.
Morgan, Simplifications For Analysis of Saw Multipole Resonators, *1993 Ultrasonics Symposium*, pp. 167–172.
Steven et al., Stopband Level of 2–Port Saw Resonator filters, *1977 Ultrasonics Symposium Proceedings*, pp. 905–908.

*Primary Examiner*—Mark O. Budd
*Attorney, Agent, or Firm*—Jones, Day, Reavis & Pogue

[57] ABSTRACT

An acoustic wave device in which the propagation path of the surface acoustic wave device is folded to increase the wave propagation path length in order to make better use of the total chip space.

5 Claims, 3 Drawing Sheets

MULTITRACK TRANSVERSELY FOLDED SURFACE ACOUSTIC WAVE STRUCTURE

BACKGROUND OF THE INVENTION

1. Field of the Invention

The present invention relates in general to surface acoustic wave devices and in particular to an acoustic wave device in which the propagation path of the surface acoustic wave device is folded in order to make better use of the total chip length.

2. Description of Related Art

It is well known in the surface acoustic wave art that in order to get a narrower bandwidth, the longer the surface acoustic wave device must be. Of course, the longer the device is, the larger the chip size that is required and thus there is less efficient use of circuit space. It has been known to use first and second transversely-spaced transducers separated by a first multistrip complex (MSC) with a second MSC longitudinally spaced from and overlapping the first transducer and a portion of the first MSC. A third MSC is also longitudinally spaced from and overlaps the remaining portion of the first MSC and the second transducer. A wave propagated by the first transducer is reflected by the second MSC to the first MSC and from the first MSC back to the third MSC. The third MSC again reflects the signal back to the output transducer. Thus, the propagation path of the surface acoustic wave signal has been lengthened four times. The disadvantage with this device is that the reflecting MSC's are lossy and thus the entire filter is a high-loss device. Further, because the travel path has to pass through three multistrip coupling devices, signal distortion occurs.

Other filters include input and output transducers that are both transversely spaced and longitudinally spaced with respect to each other and with two slightly inclined reflectors therebetween to form a Z-shaped filter. Thus the signal from the first transducer travels longitudinally until it encounters the first inclined reflector which reflects the signal at an inclined angle in the reverse direction where it encounters the second Z-shaped reflector. The signal is again reflected longitudinally to the output transducer. This device again is a lossy device because of the reflector gratings. Further, because of the inclined angle of the reflector gratings, increased signal distortion occurs.

It would be extremely important for a surface acoustic wave (SAW) device to be made such that the propagation path is folded in order to produce an output signal that is equivalent to that generated by a much longer surface acoustic wave device. Such device, if it could be made with low loss and low distortion, would conserve chip space and enable the use of much smaller chip sizes.

French Patent No. 2,685,580 discloses a double-ended version of such a SAW device in which the propagation path is folded. As disclosed therein, N independent in-line surface acoustic wave (SAW) devices are utilized where $N \geq 3$ and is only an odd integer. Each device again includes at least an input transduction means and an output transduction means. A common input signal terminal is coupled to each of the input transduction means and a common output terminal is coupled to each of the output transduction means. One of the in-line SAW devices has a cavity between the input and output transduction means with a length of $X\lambda$ where X is an arbitrary number. The cavity in each of the N−1 remaining in-line SAW devices has a length of $$X\lambda + 360° \left( \pm M_n + \frac{n-1}{N} \right)$$

where M is an arbitrary constant including zero and n=the individual track number. This allows a differential time delay, $\Delta t$, to occur between the application of an input signal to the common input terminal and the detection of an output signal at the common output terminal to be substantially N times the corresponding delay of the first cavity alone.

SUMMARY OF THE INVENTION

The present invention relates to a multitrack transversely folded surface acoustic wave structure that includes either single-ended devices, i.e., the input transducer is also the output transducer, or double-ended devices in which there is an input transducer longitudinally spaced in-line from the output transducer.

In the single-ended devices, N independent in-line surface acoustic wave devices are arranged in a parallel relationship to each other and where $N \geq 2$ and is an integer. Thus each of the single-ended devices includes a transduction means and at least one spaced reflecting means in each of the N independent in-line surface acoustic wave devices. A common input terminal is coupled to each of the transduction means for applying input signals to the transduction means and for receiving output signals from the transduction means. Thus all of the devices have a cavity separating the transduction means and the reflecting means. A first cavity in one of the in-line surface acoustic wave devices has a length of $X\lambda$ where X is an arbitrary number and second cavity means are in each of the N−1 remaining in-line surface devices, each second cavity having a length of $$X\lambda + 180° \left( \pm M_n + \frac{n-1}{N} \right) \tag{1}$$

where n=the individual track number and M is an arbitrary constant including zero such that a differential time delay, $\Delta t$, occurs between the application of an input signal to the common terminal and the detection of an output signal at the common terminal where $$\Delta t = \frac{1}{f} \left( \pm M_n + \frac{1}{N} \right)$$

and f=the center frequency of the device. The differential time delay, $\Delta t$, is substantially N times the corresponding delay of the first cavity alone. This means that if three independent in-line surface acoustic wave devices are coupled together as stated, the equivalent length of the transducer is three times that of one of the N independent in-line surface acoustic wave devices by itself. This advantage occurs because, when the cavity lengths are adjusted according to equation (1) set forth earlier, a signal applied to N independent in-line SAW devices will, when reflected, cancel each other at the transduction means and cause the transduction means to appear as a short and thus be reflected again to the reflector grating. This will occur N times for N independent in-line surface acoustic wave devices until no cancellation occurs and an output signal is generated at the common output terminal.

Thus it is an object of the present invention to provide a multitrack transversely folded surface acoustic wave structure.

It is also an object of the present invention to use N independent in-line surface acoustic wave devices where $N \geq 2$ and is an integer with each device being single-ended and including a transduction means and at least one reflecting means with the device being constructed such that a differential time delay, Δt, occurs between the application of an input signal to the common terminal and the detection of an output signal at the common terminal and is substantially N times the corresponding delay of one of the independent in-line surface acoustic wave devices by itself.

Thus the present invention relates to a single-ended multitrack transversely folded surface acoustic wave structure comprising N independent in-line surface acoustic wave devices where N≦2 and is an integer, each device including a transduction means and at least one reflecting means, a common terminal coupled to each of the transduction means for applying input signals to the transduction means and receiving output signals from the transduction means, a first cavity in one of the in-line surface acoustic wave devices having a length of Xλ where X is an arbitrary number and second cavity in each of the N−1 remaining in-line surface acoustic wave having a length of $$X\lambda + 180° \left( \pm M_n + \frac{n-1}{N} \right) \quad (1)$$

where M is an arbitrary constant including zero such that the differential time delay, Δt, occurring between the application of an input signal to the common terminal and the detection of an output signal at the common terminal of said N in-line SAW devices is substantially N times the corresponding delay of the first cavity means alone.

BRIEF DESCRIPTION OF THE DRAWINGS

These and other objects of the present invention will be more fully understood when taken in conjunction with the accompanying DETAILED DESCRIPTION OF THE DRAWINGS in which.

DETAILED DESCRIPTION OF THE DRAWINGS

Figure 1:
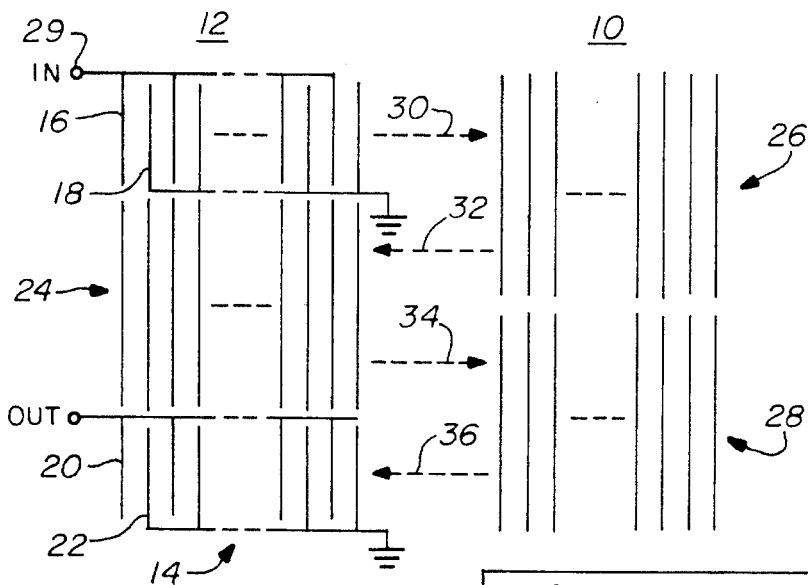
FIG. 1 is a diagrammatic representation of a prior art transversely folded SAW device.

FIG. 1 is a diagrammatic representation of a prior art transversely folded SAW device. The device 10 includes an input transducer 12 formed with interdigitated fingers 16 and 18 and output transducer 14 transversely spaced therefrom and formed of interdigitated fingers 20 and 22. Transducers 12 and 14 are separated by a first multistrip coupler 24 formed of a plurality of spaced electrode fingers. A second multistrip coupler 26 is longitudinally spaced from transducer 12 and overlaps the first transducer 12 and a portion of the first transducer 24. A third multistrip coupler 28 is longitudinally spaced from the output transducer 14 and overlaps the remaining portion of the first multistrip coupler 24 and the second transducer 14. An input signal at input terminal 29 causes input transducer 12 to generate a surface acoustic wave in a substrate that follows the path designated by the phantom arrow 30 towards the second multistrip coupler 26. The wave is reflected back along a path 32 to the first multistrip coupler structure 24. It is reflected again back along path 34 to the third multistrip coupler 28 and finally is reflected back towards the output transducer 14 along path 36. In this device, it can be seen that the propagation path of the surface acoustic wave signal has been lengthened at least twice. However, because the multistrip couplers are lossy, the entire filter is a high-loss device.

Figure 2:
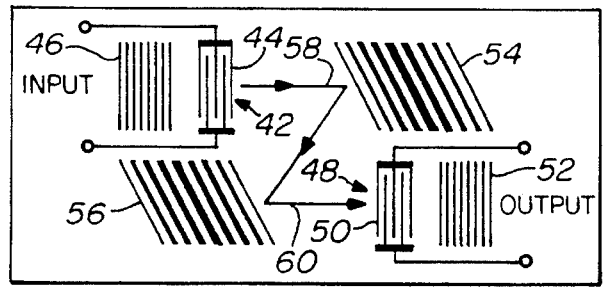
FIG. 2 is a second prior art embodiment of a transversely folded SAW device.

A second embodiment of a prior art folded path acoustic wave device is illustrated in FIG. 2. It has an input device 42 with a transducer 44 and the reflector grating 46 to make the transducer 44 unidirectional. It also has an output device 48 with a transducer 50 and reflector gratings 52. A first inclined reflector grating structure 54 and a second inclined reflector grating structure 56 are related to the input and output devices 42 and 48 such that an input signal applied to the input transducer 42 generates an acoustic wave that follows path 58. When it strikes inclined reflector grating structure 54 it is reflected downwardly and in the reverse direction to the second inclined reflector grating structure 56. From there it is reflected along path 60 to the output transducer 50 of the output device 48. Again this device is a lossy device because of the reflector gratings. Further, because of the inclined angle of the reflector gratings, increased signal distortion occurs.

Figure 3:
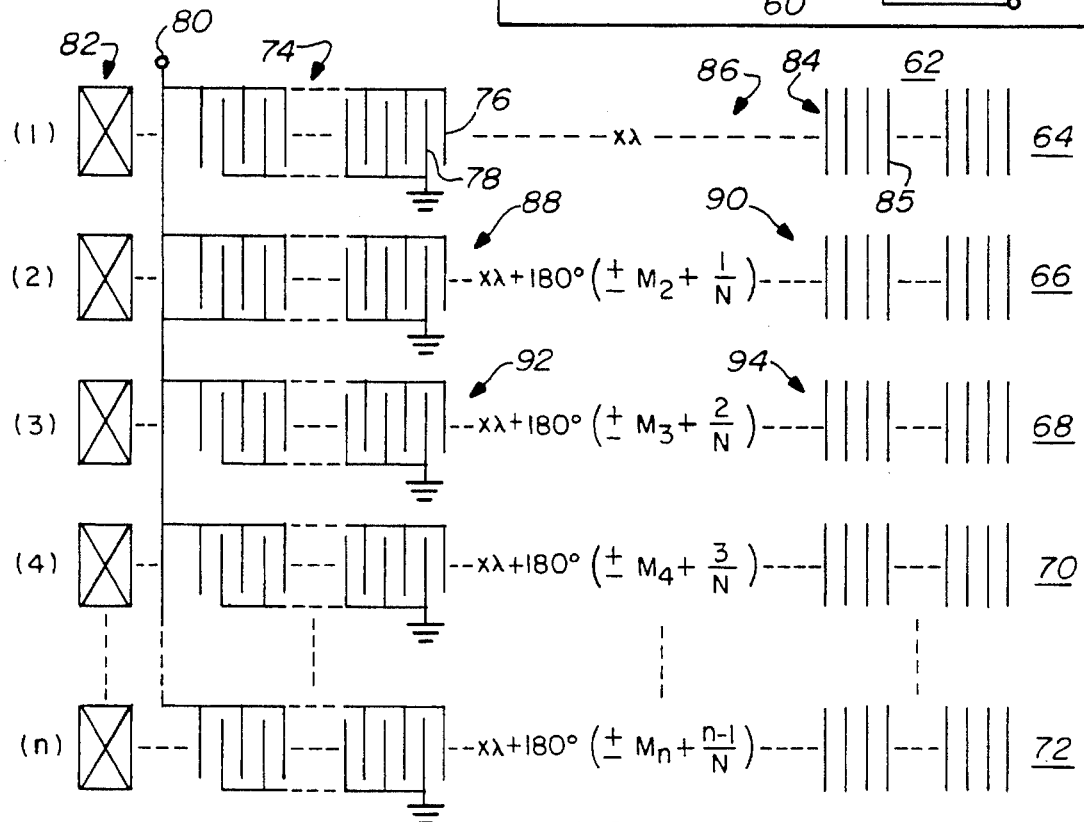
FIG. 3 is a diagrammatic representation of a single-ended multitrack transversely folded surface acoustic wave structure of the present invention.

FIG. 3 is a diagrammatic representation of a single-ended multitrack transversely folded surface acoustic wave structure of the present invention. The single-ended device 62 includes n independent in-line surface acoustic wave devices designated by the numerals 64, 66, 68, 70 and 72 all arranged in a parallel relationship to each other and where N≦2 and is an integer. Since each of the in-line surface acoustic wave devices 64–72 are identical insofar as the elements are concerned, only device 64 will be explained in detail. Device 64 includes an input transducer unit 74 that is formed of bi-directional interdigitated electrode fingers 76 and 78. A common input/output terminal 80 is coupled to all of the N input transducers in the devices 64–72. A reflector grating 82 associated with the transducer 74 may be used to make it unidirectional to the right in FIG. 3. The transduction means 74 has at least one spaced reflector means 84 formed of a plurality of parallel electrode fingers 85. The cavity 86 between the transduction means 74 and the reflecting means 84 in the surface acoustic wave device 64 has a length of Xλ. Each of the remaining in-line surface acoustic wave devices 66, 68, 70 and 72 has a cavity length 86 equal to $$X\lambda + 180° \left( \pm M_n + \frac{n-1}{N} \right) \quad (1)$$

Thus, all of the devices 64–72 have a cavity separating the transduction means 74 from the reflecting means 84. The first cavity 86 in the first in-line surface acoustic wave device 64, as stated, has a length of Xλ where X is an arbitrary number and λ=wavelength. The second cavity means are in each of the N−1 remaining in-line surface devices wherein each second cavity has the length indicated earlier which is equation (1) set forth above. In this equation, M is an arbitrary constant including zero such that a differential time delay, Δt, occurs between the application of an input signal to the common terminal 80 and the detection of an output signal at the common terminal 80. The differential time delay, Δt, is substantially N times the corresponding delay of the first cavity alone. This means that if three independent in-line surface acoustic wave devices are coupled together as stated, the equivalent length of the transducer is three times that of one of the N independent in-line surface acoustic wave devices by itself. This advantage occurs because, when the cavity lengths are adjusted according to equation (1), a signal applied to the N independent in-line SAW devices will, when reflected, cancel each other at the transduction means and cause the transduction means to appear as a short and thus be reflected again to the reflector grating. This will occur N times for N independent in-line surface acoustic wave devices until no cancellation occurs and an output signal is generated at the common output terminal 80.

Figure 4:
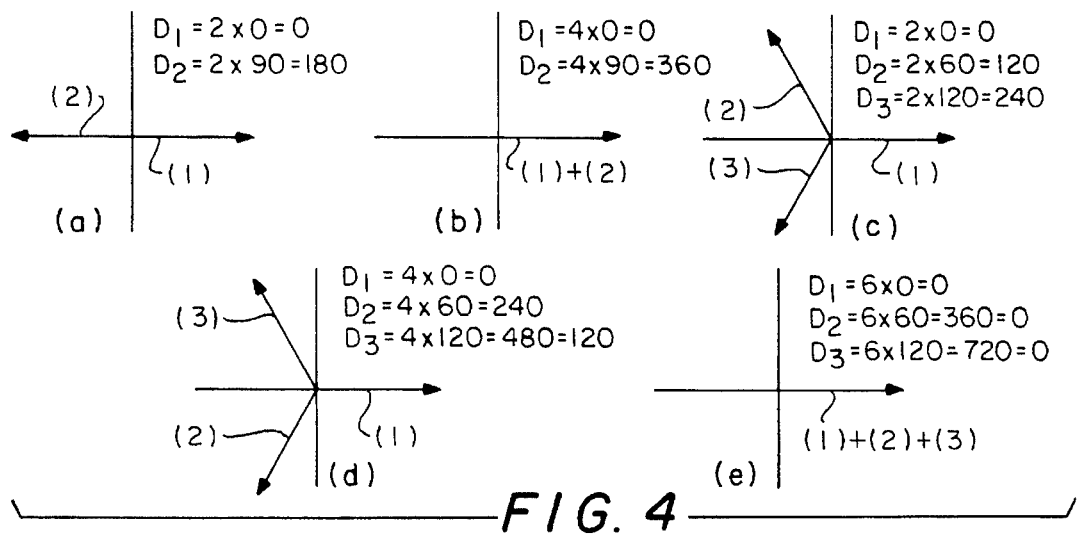
FIG. 4(a)–(e) are vector diagrams explaining the operation of the transversely folded surface acoustic wave structure in FIG. 3.

Consider the operation of the device in FIG. 3 by referring to the vector diagrams in FIG. 4. Consider first FIGS. 4(*a*) and 4(*b*) which relate to a structure as in FIG. 3 wherein N=2 and M, since it is a constant, can be ignored for the present explanation. Assume that a surface acoustic wave is generated in a substrate by applying a signal to input terminal 80 and causing transduction means 74 to generate said acoustic wave. Assume that it travels along a path through cavity 86 to reflector 84 and is reflected back to the transducer 74. Since the distance Xλ can be adjusted, the phase of the reflected signal can be shown as zero by vector 1 in FIG. 4(*a*). According to equation 1, and ignoring M as a constant, this means that the same signal generated in the substrate by the second transducer in the second in-line surface acoustic wave device 66 will travel 180° (½) or 90° in one direction. Thus the signal, as generated in the substrate by transducer 88, travels to reflector 90 and achieves a 90° phase separation from the signal generated by the first transducer 74. The wave is then reflected by the reflector grating structure 90 and travels another 90° back to the input transducer 88. This means that the signal arriving at transducer 88 is now 180° out-of-phase with the signal in the first in-line surface acoustic wave device 64. Thus as shown in FIG. 4(*a*) the reflected signals arriving back at input transducers 76 and 88 are 180° out-of-phase with each other. This means that the two transducers 74 and 88 appear as electrical shorts and thus the signal is reflected once again back toward the reflector grating structures 84 and 90.

Referring now to FIG. 4(*b*), it can be seen that again the first reflected signal from transducer 74 travels to the grating structure 84 and again arrives back at transducer 74 at 0°. It has now made four trips at 0°. However, the signal from the second in-line surface acoustic wave device 66 is reflected by transducer 88 back to reflector grating 90 where it again is reflected back to the transducer 88. Now it has traveled another 180°, which makes it now back at 0°. At this point the two signals are inphase with each other and an output is generated at the output terminal 80. Since the signal has had to make two round-trips before an output is generated, this structure provides a transducer whose length is twice that of a single transducer with a cavity length of Xλ.

Consider now a three-transducer structure comprising in-line surface acoustic wave structures 64, 66 and 68 in FIG. 3 and refer to FIGS. 4(*c*), 4(*d*) and 4(*e*). Again, the surface acoustic wave generated by transducer 74 in the first in-line structure 64 travels to the reflector grating 84 and is reflected back to the transducer 74 to give a 2×0°=0° phase shift that is illustrated by the arrow indicated by (1) in FIG. 4(*c*). In the second in-line surface acoustic wave structure 66, the second transducer 88 generates a wave which is 60° out-of-phase with the first wave according to equation 1 (180×⅓=60°) and the signal thus travels from transducer 88 to the reflector 90 and back to the transducer 88. This means that it has shifted in phase 120° in the round-trip as shown in FIG. 4(*c*) by the arrow designated by (2). The surface acoustic wave generated by the third transducer 92 travels to the reflector grating 94 and is reflected back to the transducer 92. In this case, the phase shift caused by the cavity length is 180° (⅔) or 120°. Thus the wave shifts 120° in traveling to the reflector 94 and is reflected back causing another 120° phase shift to the transducer 92. This is a phase shift of 240° as indicated by the arrow (3) in FIG. 4(*c*). Since each of the vectors in FIG. 4(*c*) are 120° out-of-phase, there is total cancellation of the signal and all three transducers appear to be at an electrical short thus reflecting the waves back toward their respective reflectors once again.

Consider now FIG. 4(*d*). Again, the reflected wave in the first in-line surface acoustic wave structure 64 will travel back to its reflector grating 84 and be reflected back to the transducer 74 again at 0° because of the fixed spacing in the cavity 86 of Xλ. However, in the second in-line surface acoustic wave structure 66, the reflected wave will shift another 60° traveling to its reflector grating structure 90 and another 60° traveling back to the transducer 88. This means that the initial signal has made four phase shifts of 60°, which is 240°. That is illustrated by the arrow (2) in FIG. 4(*d*). The third in-line surface acoustic wave structure 68 has the transducer 92 generate the surface acoustic wave signal toward its reflecting structure 84 for another 120° phase shift and is reflected back to the transducer 92 for another 120° phase shift. It has now shifted 4×120°, or 480°, which is equivalent to 120°. This is illustrated by arrow or vector (3) in FIG. 4(*d*). Again, it can be seen that the three signals are 120° apart and thus cancel and the three transducers 74, 88 and 92 all appear to be short circuits and once again reflect the signals back toward their respective reflectors.

Consider now FIG. 4(*e*). Again, the first surface acoustic wave structure 64 reflects the wave at 0°. However, the second structure 66 reflects the wave to the reflector 90 and back for six reflections, or six trips, and 6×60°=360°, or it is at zero, as illustrated in FIG. 4(*e*). In like manner, the signal reflected by transducer 92 again travels to reflector grating 94 and back to the transducer 92 for a total trip of 6×120°, or 720°, which again is equal to zero. At this point, all three signals are inphase and an output is generated at output terminal 80. This transducer then has the net effect of being substantially N times the length of a single one of the transducers or having a differential delay time, Δt, occur between the application of an input signal to the common input terminal 80 and the detection of an output signal at the common output terminal 80 that is substantially N times the corresponding delay of the first cavity alone. Thus the structure in FIG. 3 can be shown to be made as long as desired by adjusting the N number of surface acoustic wave structures in parallel arrangement as shown. It should be noted that each of the in-line surface acoustic wave structures 64, 66, 68, 70 and 72 in FIG. 3 are independent from each other and can each be placed on a separate substrate and simply have their common input/output terminals coupled together. They do not need to be on the same substrate but obviously can be and, in most arrangements, for practical purposes, would be so constructed.

Figure 5:
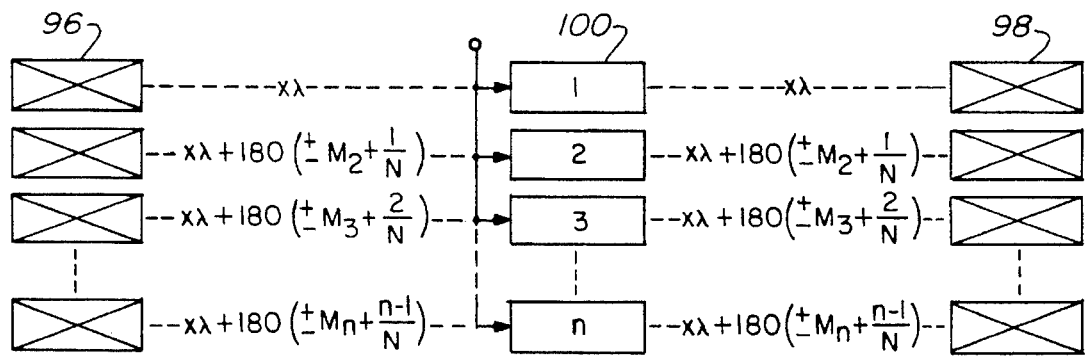
FIG. 5 is a diagrammatic representation of a second single-ended embodiment of the multitrack transversely folded surface acoustic wave structure having a reflector on each side of the common input/output transducer.

FIG. 5 is a single-ended structure that operates similar to that illustrated in FIG. 3 except that it has a reflector on both sides of the input/output transducer. Thus in FIG. 5, there are N parallel input/output transducers illustrated as 1, 2, 3, —N. There is also a corresponding respective reflecting grating structure 96 and 98 on each side of the input/output transducer. A cavity is formed on each side of the input/output transducer 1 of $X\lambda$ as explained earlier. The others have a cavity having a length of $$X\lambda + 180° \left( \pm M_n + \frac{n-1}{N} \right) \quad (1)$$

as explained earlier. By following the same procedure as illustrated in FIGS. 4(a)–(e), and considering the gaps on both sides of each of the input/output transducers to be the same, the same operational result is obtained as explained previously with relation to FIG. 3.

Figure 6:
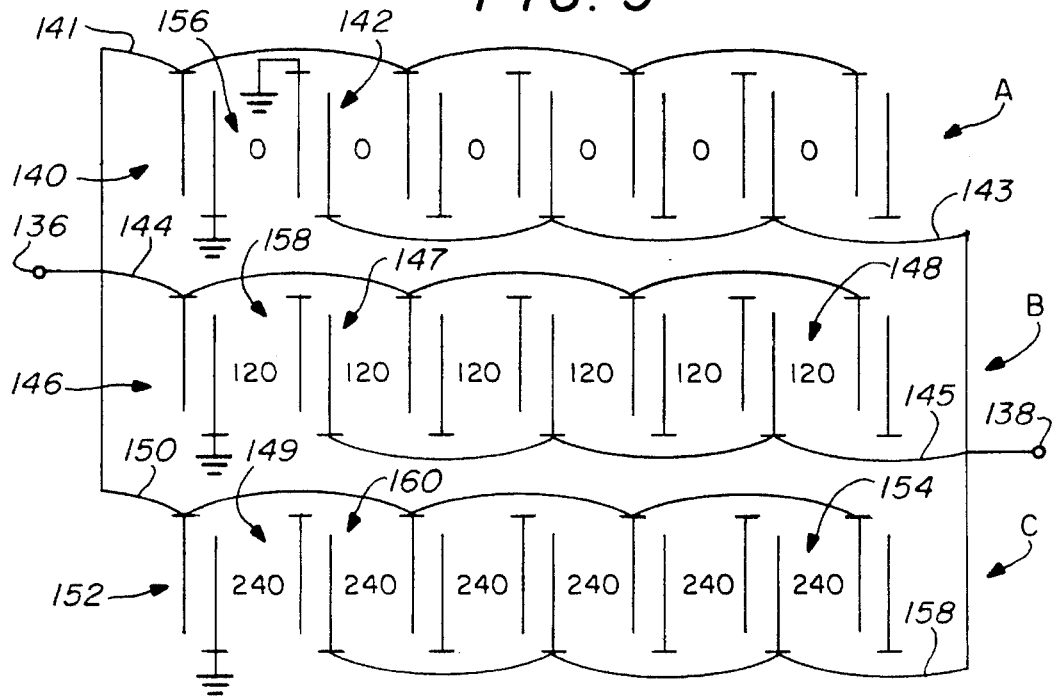
FIG. 6 discloses a double-ended version of a multitrack transversely folded surface acoustic wave structure using interdigital transducers as the input and output devices.

FIG. 6 is a double-ended version of a multitrack transversely folded surface acoustic wave structure using k interdigitated interdigital transducers as the input and output devices where $k \geq 2$. Thus the first in-line surface acoustic wave structure, designated by the letter A, has input transducers 140 and output transducers 142 separated by a cavity length 156 of $X\lambda$ that will obtain 0° between the input and the output. All of the input transducers 140 are coupled together by a common input line 141 coupled to input terminal 136 and all of the output transducers 142 are coupled together by a common output line 143 that is coupled to output terminal 138. In like manner, the second in-line surface acoustic wave structure, designated by the letter B, consists of input transducers 146 all coupled together by a common input line 144 coupled to input terminal 136 and all output transducers 148 coupled by a common line 145 to common output terminal 138. The spaces or cavities 158 in this in-line surface acoustic wave structure are spaced such as to obtain 120° phase shift from the input to the output according to equation (2). Finally, the third in-line surface acoustic wave structure, designated by the letter C, has a plurality of input transducers 152 all coupled together by a common line 150 that is coupled to common input terminal 136. All of the output transducers 154 are coupled together by a common line 153 that is coupled to the common output terminal 138. In this case, the cavity length 160 between the input and output transducers causes a 240° phase shift. If the analysis that has been made previously for the device of FIG. 3 will be applied to the device of FIG. 6, it will be seen that equation (2) applies here where $N \leq 3$ and is an odd integer.

As can be seen in FIG. 6, the cavity 156 in the first in-line surface acoustic wave structure has a length of $X\lambda$. Each of the subsequent cavities in the remaining $N-1$ surface acoustic wave in-line structures has a cavity length $$\frac{360°}{N}$$

or $$X\lambda + 360° \left( \pm M_n + \frac{n-1}{N} \right) \quad (2)$$

Figure 7:
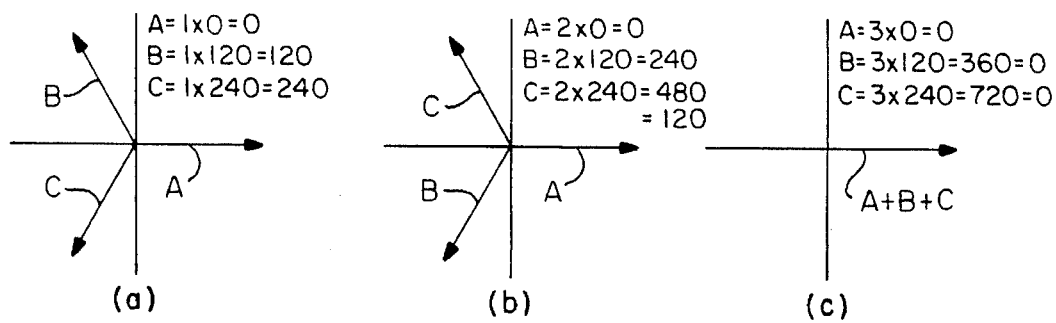
FIG. 7(a), (b), and (c), are vector diagrams explaining the operation of the device in FIG. 6.

Consider how this device functions utilizing only the first three surface acoustic wave structures shown in FIG. 6. Consider also FIG. 7(a), (b), and (c). Again, a signal is applied to common input terminal 136 to each of the input transducers 140, 146, 152 on lines 141, 144, and 150, respectively. Considering the first transducer group A, the signal travels the cavity length 156 of $X\lambda$, and is received by transducer 142 at 0° phase shift. The same signal leaving input transducer 146 in group B, however, travels that same distance plus a 360° ×(⅓) or 120° phase shift. Again, that same signal leaving input transducer 152 in group C travels the same distance as the first cavity plus 360°× (⅔) or 240°. These signals are shown plotted in FIG. 7(a) and, of course, cancel each other. Thus the output transducers 142,147, and 149 in each group appear to be a short circuit and reflect the signal back to the input transducers 140, 146, and 152. The signal from the first output transducer 142 will again arrive back at the input transducer 140 at 0° phase shift as shown by vector A in FIG. 7(b). However, the signal reflected by the second output transducer 147 travels back to the second input transducer 146 again with a 120° phase shift. Thus the signal has now traveled 2×120° or 240°, as shown by vector B in FIG. 7(b). The third output transducer 149 reflects the signal back to the third input transducer 152 over a second period of 360°×⅔ or 240° which, when added to the first 240°, is now 480° as shown by vector C in FIG. 7(b). Thus again the signals are 120° out-of-phase as they arrive at the first, second and third input transducers 140, 146 and 152 and cancel each other. Again, the three input transducers 140, 146 and 152 appear to be a short circuit and reflect the signal once more back to the three output transducers 142, 147 and 149. This time, again, the first signal traveling the first gap $X\lambda$ will have a phase shift of 3×0°, or 0° as shown in FIG. 7(c). The signal from the second output transducer 146 will have a phase shift of 3×120°, or 360°, or 0°, also as shown in FIG. 7(c). Finally, the third signal will have a phase shift of 3×240°, or 720°, or 0° and thus there is an output signal generated at the common output terminal 138. Thus, with this structure in FIG. 6 where $N \leq 3$ and is only an odd integer, the circuit allows a differential time delay, $\Delta t$, to occur between the application of an input signal to the common input terminal and the detection of an output signal at the common output terminal to be substantially N times the corresponding delay of the first cavity alone.

Thus, there has been disclosed a multitrack transversely folded surface acoustic wave structure, either single-ended devices or a double-ended devices utilizing N interdigitated interdigital transducers, in which a differential time delay, $\Delta t$, is substantially N times the corresponding delay of a cavity width of a single transducer. In one case, n independent in-line surface acoustic wave devices are constructed where $N \leq 2$ and is an integer with each device being single-ended and including a transduction means and at least one reflecting means with the device being constructed such that a differential time delay, $\Delta t$, occurs between the application of an input signal at the common terminal and the detection of an output at the common terminal and is substantially N times the corresponding delay of the first one of the independent in-line surface acoustic wave devices by itself. In the second embodiment, the multitrack transversely folded surface-acoustic wave structure has N groups of independent in-line surface acoustic wave devices wherein $N \leq 3$ and is only an odd integer with each device being double-ended and formed with a plurality of pairs of interdigitated interdigital input and output transducers with a common input signal terminal coupled to each of the input transducers and a common output terminal coupled to each of the output transducers. With the cavity lengths of the pairs of N independent in-line SAW devices being adjusted accordingly, the differential time delay, $\Delta t$, occurring between the application of an input signal to the common input terminal and the detection of an output signal at the common output terminal is substantially N times the corresponding delay of the first cavity alone.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:
1. A multitrack transversely folded surface acoustic wave structure comprising:

N independent in-line surface acoustic wave devices where N≦2 and is an integer, each device including a transduction means and at least one reflecting means;

a common terminal coupled to each of the transduction means for applying input signals to the transduction means and receiving output signals from the transduction means;

first cavity means in one of said in-line surface acoustic wave devices having a length of $X\lambda$ where X is an arbitrary number; and second cavity means in each of the N−1 remaining in-line surface acoustic wave devices having a length of $$X\lambda + 180° \left( \pm M_n + \frac{n-1}{N} \right)$$

where n=the individual track number and M is an arbitrary constant including zero such that the differential time delay, Δt, occurring between the application of an input signal to the common terminal and the detection of an output signal at the common terminal of said N in-line SAW devices is substantially N times the corresponding delay of the first cavity means alone.

2. A multitrack transversely folded surface acoustic wave structure as in claim 1 wherein the differential time delay, Δt, is expressed as $$\Delta t = \frac{1}{f} \left( \pm M_n + \frac{1}{N} \right).$$

3. A multitrack transversely folded surface acoustic wave structure comprising:

k spaced interdigitated interdigital transduction means forming each of N groups of independent in-line surface acoustic wave devices where N≦3 and is only an odd integer, each group of devices including at least two parallel input transduction means and at least two corresponding parallel output transduction means;

a common input signal terminal coupled to each of said N groups of said input transduction means;

a common output terminal coupled to each of said N groups of said output transduction means;

a first cavity between an input and corresponding output transducer means in one of said groups of in-line SAW device having a length of $X\lambda$ where X is an arbitrary number;

a second cavity in each of the N−1 remaining groups of in-line SAW devices having a length of $$X\lambda + 36° \left( \pm M_n + \frac{n-1}{N} \right)$$

where M is an arbitrary constant including zero and n=the individual track number;

each of the between adjacent ones of the k interdigitated interdigital transduction means in one of said N independent in-line SAW devices forming said first cavity; and each of the spaces between adjacent ones of the k interdigitated interdigital transduction means in each of the remaining N−1 in-line SAW devices forming said second cavity, such that the differential time delay, Δt, occurring between the application of an input signal to the common input terminal and the detection of an output signal at the common output terminal is substantially N times the corresponding delay of the first cavity alone.

4. A multitrack transversely folded surface acoustic wave structure as in claim 3 wherein the differential time delay, Δt, is expressed as $$\Delta t = \frac{1}{f} \left( \pm M_n + \frac{1}{N} \right)$$

where f=the center frequency of the structure.

5. A multitrack transversely folded acoustic wave structure as in claim 1 wherein said at least one reflecting means comprises:

first and second reflecting means in each of said N independent in-line SAW devices separated by said transduction means to form first and second cavities, one on each side of said transduction means;

said first and second cavities in one of said N independent in-line SAW devices having equal lengths of $X\lambda$ where X is an arbitrary number; and said first and second cavities in each of said remaining N−1 in-line SAW devices having equal lengths of $$X\lambda + 18° \left( \pm M_n + \frac{n-1}{N} \right)$$

where n=the individual track number and M is an arbitrary constant including zero such that the differential time delay, Δt, occurring between the application of an input signal to the input terminal and the detection of an output signal at the output terminal of said N in-line SAW devices is substantially N times the corresponding delay of the first cavity alone.

* * * * *

UNITED STATES PATENT AND TRADEMARK OFFICE
CERTIFICATE OF CORRECTION

PATENT NO. : 5,545,940
DATED : Aug. 13, 1996
INVENTOR(S) : Wright

It is certified that error appears in the above-indentified patent and that said Letters Patent is hereby corrected as shown below:

The first page of the patent, under [56] "References Cited", in the first line under "Other Publications", "If-Filters" should read --IF-Filters--

Col. 2:
    line 21, "$N \leq 2$" should read -- $N \geq 2$ --;
    line 67, "$N \leq 2$" should read -- $N \geq 2$ --;

Col. 3:
    line 11, "$N \leq 2$" should read -- $N \geq 2$ --;

Col. 4:
    line 39, "$N \leq 2$" should read -- $N \geq 2$ --;

Col. 7:
    line 42, "$N \leq 3$" should read -- $N \geq 3$ --;

Col. 8:
    line 25, "$N \leq 3$" should read -- $N \geq 3$ --;
    line 38, "$N \leq 2$" should read -- $N \geq 2$ --;
    line 49, "$N \leq 3$" should read -- $N \geq 3$ --;

UNITED STATES PATENT AND TRADEMARK OFFICE
CERTIFICATE OF CORRECTION

PATENT NO. : 5,545,940
DATED : Aug. 13, 1996
INVENTOR(S) : Wright

It is certified that error appears in the above-indentified patent and that said Letters Patent is hereby corrected as shown below:

Col. 9:
    line 5, "N≤2" should read -- N≥2 --;
    line 39, "N≤3" should read -- N≥3 --; and
Col. 10:
    line 7, after "each of the" and before "between", insert -- spaces --.

Col. 10, line 1, (in the equation), " 36° " should read -- 360° --; and

Col. 10, line 43, (in the equation), " 18° " should read -- 180° --.

Signed and Sealed this

Eleventh Day of March, 1997

*Attest:*

BRUCE LEHMAN

*Attesting Officer*     *Commissioner of Patents and Trademarks*